(12) United States Patent
Ma

(10) Patent No.: US 10,467,966 B2
(45) Date of Patent: Nov. 5, 2019

(54) SHIFT REGISTER AND A METHOD FOR DRIVING THE SAME, A GATE DRIVING CIRCUIT AND DISPLAY APPARATUS

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 211 days.

(21) Appl. No.: 15/214,401

(22) Filed: Jul. 19, 2016

(65) Prior Publication Data
US 2017/0193916 A1 Jul. 6, 2017

(30) Foreign Application Priority Data

Jan. 5, 2016 (CN) .......................... 2016 1 0005852

(51) Int. Cl.
*G11C 19/00* (2006.01)
*G09G 3/3266* (2016.01)
(Continued)

(52) U.S. Cl.
CPC ........... *G09G 3/3266* (2013.01); *G11C 19/28* (2013.01); *G09G 3/3677* (2013.01); *G09G 2300/0408* (2013.01); *G09G 2300/0426* (2013.01); *G09G 2300/0465* (2013.01); *G09G 2310/0286* (2013.01)

(58) Field of Classification Search
None
See application file for complete search history.

(56) References Cited

U.S. PATENT DOCUMENTS 8,109,039 B2 * 2/2012 Kruger .................. B60J 5/0416
49/348
9,754,551 B2 * 9/2017 Jeoung ................... G09G 5/003
(Continued)

FOREIGN PATENT DOCUMENTS

CN 1758321 A 4/2006
CN 101939791 A 1/2011

*Primary Examiner* — Tuan T Lam
(74) *Attorney, Agent, or Firm* — Kinney & Lange, P.A.

(57) ABSTRACT

According to the embodiments of the disclosure, a shift register and a method for driving the same, a gate driving circuit and a display apparatus may be provided. The shift register includes an input module, a node control module, a first output module and a second output module. The input module may control a potential at a first node via an input signal end and a first clock signal end, the node control module may configured to control the potential at a first node via a first control signal end and a DC signal end, the first output module may control the potential at a driving signal output end via a second control signal end and the DC signal end, and the second output module may maintain a voltage difference between the first node and the driving signal output end in a stable state when the first node is in a floating state and control the potential at the driving signal output end via the first node and the second clock signal end. By cooperating with each other, these four modules may achieve the outputs of scanning signals with a simpler structure and a fewer signal lines, so as to simplify the manufacturing process and reduce the production cost.

11 Claims, 14 Drawing Sheets

(51) Int. Cl.
  *G11C 19/28* (2006.01)
  *G09G 3/36* (2006.01)

(56) References Cited

U.S. PATENT DOCUMENTS

| | | | |
|---|---|---|---|
| 2014/0037043 A1* | 2/2014 | Yoon | G11C 19/00 377/64 |
| 2014/0071104 A1* | 3/2014 | Gao | G11C 19/28 345/208 |
| 2014/0119491 A1* | 5/2014 | Liu | G11C 19/28 377/64 |
| 2015/0187320 A1* | 7/2015 | Ren | G09G 3/3696 345/87 |
| 2015/0213762 A1* | 7/2015 | Xia | G09G 3/3266 345/215 |
| 2015/0262703 A1* | 9/2015 | Murakami | G09G 3/20 345/214 |
| 2015/0279481 A1* | 10/2015 | Sasaki | G11C 19/184 377/69 |
| 2016/0155409 A1* | 6/2016 | Jeoung | G09G 5/003 345/214 |
| 2016/0155422 A1* | 6/2016 | Sun | G09G 3/20 345/213 |
| 2016/0187917 A1* | 6/2016 | Lou | G09G 3/2096 345/213 |
| 2016/0217757 A1* | 7/2016 | Tanaka | G09G 3/3677 |
| 2016/0260398 A1* | 9/2016 | Yao | G09G 3/3648 |
| 2017/0046998 A1* | 2/2017 | Zhang | G09G 3/2092 |

* cited by examiner

SHIFT REGISTER AND A METHOD FOR DRIVING THE SAME, A GATE DRIVING CIRCUIT AND DISPLAY APPARATUS

TECHNICAL FIELD

The present disclosure relates to the field of display technology, and more particularly, to a shift register and a method for driving the same, a gate driving circuit and a display apparatus.

BACKGROUND

With the rapid development of display technology, displays have a development trend to high integrity and a low cost. The Gate Driver on Array (GOA) technology is to integrate a gate switch circuit of a Thin Film Transistor (TFT) onto an array substrate of a display panel to achieve scanning and driving of the display panel, so as to omit a bonding region and a wiring space of a fan-out region of an Integrated Circuit (IC). This can not only reduce a product cost in terms of a material cost and manufacturing processes, but also can achieve an aesthetic design of the display panel with two symmetrical sides and a narrow frame. Further, such integration process can further omit bonding processes in the direction of gate scanning lines, so as to improve the productivity and yield.

Generally, the existing GOA circuit is comprised of a plurality of cascaded shift registers. Each of driving signal output ends of various stages of shift registers corresponds to a gate line, to arrange various gate lines in turn along a scanning direction. Although the output of the scanning signals can be achieved by inputting various control signal having different functions, the number of switch transistors of the various stages of shift registers constituting the GOA circuit will be increased, and connecting structures between the various stages of switch transistors will complicate the GOA circuit, which may further cause a complex manufacturing process and an increased cost. In a worse situation, by using a plurality of signal lines to provide the various control signal having different functions to the various stages of shift registers, this may cause a reduced aperture opening ratio of the display panel, thereby degrading the competitiveness of output of the display panel.

SUMMARY

Embodiments of the present disclosure provide a shift register and a method for driving the same, a gate driving circuit and a display apparatus, which has a simple structure and reduces the amount of signal lines having different functions which are required to be connected so as to achieve outputs of scanning signals. Therefore, manufacturing process can be simplified, and the production cost can also be reduced.

Therefore, the embodiments of the present disclosure may provide a shift register, comprising:

an input module having a first end connected to an input signal end, a second end connected to a first clock signal end, and a third end connected to a first node, the input module being configured to provide a signal from the input signal end to the first node under the control of the first clock signal end;

a node control module having a first end connected to a DC signal end, a second end connected to a first control signal end and a third end connected to the first node, the node control module being configured to provide a signal from the DC signal end to the first node under the control of the first control signal end;

a first output module having a first end connected to the DC signal end, a second end connected to a second control signal end, and a third end connected to a driving signal output end of the shift register, the first output module being configured to provide the signal from the DC signal end to the driving signal output end under the control of the second control signal end; and a second output module having a first end connected to a second clock signal end, a second end connected to the first node, and a third end connected to the driving signal output end, the second output module being configured to provide a signal from the second clock signal end to the driving signal output end under the control of the first node and to maintain a voltage difference between the first node and the driving signal output end in a stable state when the first node is in a floating state.

In one implementation, the input module may further comprise a first switch transistor having a source connected to the input signal end, a gate connected to the first clock signal end, and a drain connected to the first node.

In another implementation, the node control module may further comprise a second switch transistor having a source connected to the DC signal end, a gate connected to the first control signal end, and a drain connected to the first node.

In another implementation, the first output module may further comprise a third switch transistor having a source connected to the DC signal end, a gate connected to the second control signal end, and a drain connected to the driving signal output end.

In another implementation, the second output module may further comprise a fourth switch transistor and a capacitor, wherein the fourth switch transistor has a source connected to the second clock signal end, a gate connected to the first node, and a drain connected to the driving signal output end; and the capacitor has a first end connected to the first node and a second end connected to the driving signal output end.

In another implementation, the first control signal end and the second control signal end may be the same control signal end.

Accordingly, the embodiments of the present disclosure may further provide a method for driving the above shift register, comprising:

in a first phase, providing, by the node control module, the signal from the DC signal end to the first node under the control of the first control signal end, and providing, by the first output module, the signal from the DC signal end to the driving signal output end under the control of the second control signal end;

in a second phase, providing, by the input module, the signal from the input signal end to the first node under the control of the first clock signal end, and providing, by the second output module, the signal from the second clock signal end to the driving signal output end under the control of the first node;

in a third phase, when the first node is in a floating state, maintaining a voltage difference between the first node and the driving signal output end in a stable state, and providing, by the second output module, the signal from the second clock signal end to the driving signal output end under the control of the first node; and in a fourth phase, providing, by the input module, the signal from the input signal end to the first node under the control of the first clock signal end; providing, by the node control module, the signal from the DC signal end to the first node under the control of the first control signal end; and providing, by the first output module, the signal from the DC signal end to the driving signal output end under the control of the second control signal end.

Accordingly, the embodiments of the present disclosure may further provide a gate driving circuit comprising a plurality of cascaded shift registers according to the present disclosure, wherein, an input signal end of a first stage of shift register is connected to a frame trigger signal end; and each of input signal ends of remaining various stages of shift registers except for the first stage of shift register is connected to a driving signal output end of a previous stage of shift register.

Accordingly, the embodiments of the present disclosure may further provide a display apparatus comprising the gate driving circuit according to the present disclosure.

In another implementation, the display apparatus may be an organic light emitting display (OLED) apparatus.

In another implementation, the OLED apparatus may comprise a plurality of pixel circuits which are arranged in an array and configured to at least have light emitting control signal ends and scanning signal ends, and wherein each row of the pixel circuits corresponds to a shift register in the gate driving circuit, the light emitting control signal end of each row of the pixel circuits being connected to the first control signal end and the second control signal end of the corresponding shift register, and the scanning signal end of each row of the pixel circuits being connected to the driving signal output end of the corresponding shift register.

According to the embodiments of the disclosure, a shift register and a method for driving the same, a gate driving circuit and a display apparatus may be provided. The shift register may comprise an input module, a node control module, a first output module and a second output module. The input module is configured to control a potential at a first node via an input signal end and a first clock signal end, the node control module is configured to control a potential at a first node via a first control signal end and a DC signal end, the first output module is configured to control a potential at a driving signal output end via a second control signal end and the DC signal end, and the second output module is configured to maintain a voltage difference between the first node and the driving signal output end in a stable state when the first node is in a floating state and to control a potential at the driving signal output end via the first node and the second clock signal end. Thus, by cooperating with each other, these four modules may achieve the outputs of scanning signals with a simpler structure and a fewer signal lines, so as to simplify the manufacturing process and reduce the production cost.

DETAILED DESCRIPTION

Specific implementations of a shift register and a method for driving the same, a gate driving circuit and a display apparatus according to embodiments of the present disclosure will be described in detail below in conjunction with accompanying drawings.

Figure 1:
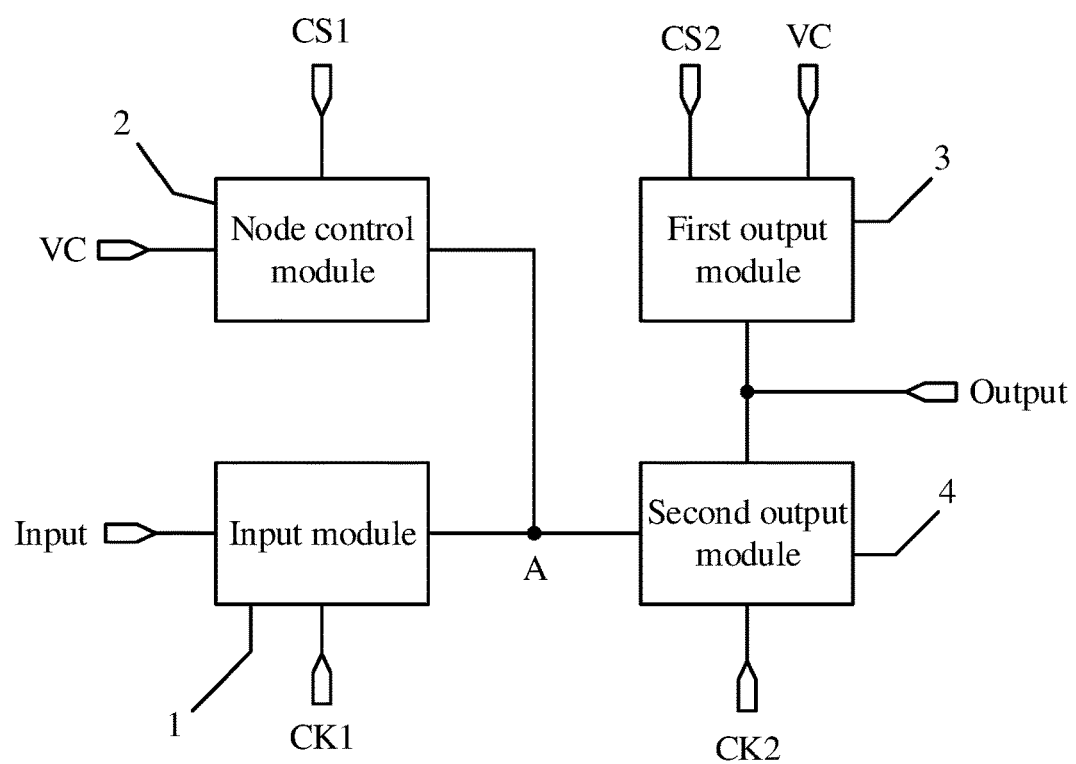
FIG. 1 is a structural diagram illustrating a shift register according to an embodiment of the present disclosure.

As shown in FIG. 1, the shift register according to the present embodiment comprises: an input module 1, a node control module 2, a first output module 3 and a second output module 4.

The input module 1 may has a first end connected to an input signal end (Input), a second end connected to a first clock signal end (CK1), and a third end connected to a first node (A). Furthermore, the input module 1 may be configured to provide a signal from the input signal end (Input) to the first node (A) under the control of the first clock signal end (CK1).

The node control module 2 may have a first end connected to a DC signal end (VC), a second end connected to a first control signal end (CS1) and a third end connected to the first node (A). Furthermore, the node control module 2 may be configured to provide a signal from the DC signal end (VC) to the first node (A) under the control of the first control signal end (CS1).

The first output module 3 may have a first end connected to the DC signal end (VC), a second end connected to a second control signal end (CS2), and a third end connected to a driving signal output end (Output) of the shift register. The first output module 3 may be configured to provide the signal from the DC signal end (VC) to the driving signal output end (Output) under the control of the second control signal end (CS2).

The second output module 4 may have a first end connected to a second clock signal end (CK2), a second end connected to the first node (A), and a third end connected to the driving signal output end (Output). The second output module 4 may be configured to provide a signal from the second clock signal end (CK2) to the driving signal output end (Output) under the control of the first node (A) and to maintain a voltage difference between the first node (A) and the driving signal output end (Output) in a stable state when the first node (A) is in a floating state.

The above shift register according to the present embodiment may comprise the input module 1, the node control module 2, the first output module 3 and the second output module 4. The input module 1 is configured to control a potential at a first node (A) via the input signal end (Input) and the first clock signal end (CK1), the node control module 2 is configured to control a potential at the first node (A) via the first control signal end (CS1) and the DC signal end (VC), the first output module 3 is configured to control a potential at the driving signal output end (Output) via the second control signal end (CS2) and the DC signal end (VC), and the second output module 4 is configured to maintain a voltage difference between the first node (A) and the driving signal output end (Output) in a stable state when the first node (A) is in a floating state and to control a potential at the driving signal output end (Output) via the first node (A) and the second clock signal end (CK2). Thus, by cooperating with each other, these four modules may achieve the outputs of scanning signals with a simpler structure and a fewer signal lines, so as to simplify the manufacturing process and reduce the production cost.

In the above shift register according to the embodiment, a first clock signal from the first clock signal end (CK1) may have a same period as a second clock signal from the second clock signal end (CK2). When an active pulse signal for the input signal end (Input) is at a low level, the DC signal end (VC) will be at a high level. Alternatively, when the active pulse signal for the input signal end (Input) is at a high level, the DC signal end (VC) will be at a low level.

In an implementation, the first clock signal and the second clock signal may both have a duty cycle of 0.5 with reversed phases.

Alternatively, when the active pulse signal of the input signal end (Input) is at a low level, the first clock signal and the second clock signal may both have a duty cycle which is greater than 0.5, wherein a low level period of the first clock signal in a cycle is between high level periods of the second clock signal in the cycle.

Alternatively, when the active pulse signal of the input signal end (Input) is at a high level, the first clock signal and the second clock signal may both have a duty cycle which is less than 0.5, wherein a high level period of the first clock signal in a cycle is between low level periods of the second clock signal in the cycle.

In particular, as shown in FIGS. 2a to 3d, the input module may comprise a first switch transistor (M1).

The first switch transistor (M1) may have a source connected to the input signal end (Input), a gate connected to the first clock signal end (CK1), and a drain connected to the first node (A).

In an implementation, as shown in FIGS. 2a to 2d, when the active pulse signal of the input signal end (Input) is at a low level, the first switch transistor (M1) may be a P-type switch transistor. Alternatively, when the active pulse signal of the input signal end (Input) is at a high level, as shown in FIGS. 3a to 3d, the first switch transistor (M1) may be a N-type switch transistor, which is not limited here.

In an implementation, when the first switch transistor (M1) is turned on under the control of the first clock signal end (CK1), the signal from the input signal end (Input) is provided to the first node (A) through the first switch transistor (M1).

A specific structure of the input module in the shift register is merely described above by way of example, and in a specific implementation, the specific structure of the input module is not limited to the above structure according to the embodiment of the present disclosure, and may also be another structure well-known by those skilled in the art, which is not limited here.

In particular, as shown in FIGS. 2a to 3d, the node control module 2 may comprise a second switch transistor (M2).

The second switch transistor (M2) may have a source connected to the DC signal end (VC), a gate connected to the first control signal end (CS1), and a drain connected to the first node (A).

In particular, the second switch transistor (M2) may be implemented to be a P-type switch transistor or a N-type switch transistor, which is not limited here. As shown in FIGS. 2a, 2b 2d and 3b, when the second switch transistor (M2) is implemented to be a P-type switch transistor, and the first control signal end (CS1) is at a high level, the second switch transistor (M2) will be turned on and will provide the signal from the DC signal end (VC) to the first node (A). Alternatively, as shown in FIGS. 2c, 3a, 3c and 3d, when the second switch transistor (M2) is implemented to be a N-type switch transistor, and the first control signal end (CS1) is at a low level, the second switch transistor (M2) will be turned on and will provide the signal from the DC signal end (VC) to the first node (A).

A specific structure of the node control module in the shift register is merely described above by way of example, and in a specific implementation, the specific structure of the node control module is not limited to the above structure according to the embodiment of the present disclosure, and may also be another structure well-known by those skilled in the art, which is not limited here.

In particular, as shown in FIGS. 2a to 3d, the first output module 3 may comprise a third switch transistor (M3).

The third switch transistor (M3) may have a source connected to the DC signal end (VC), a gate connected to the second control signal end (CS2), and a drain connected to the driving signal output end (Output).

In particular, the third switch transistor (M3) may be implemented to be a P-type switch transistor or a N-type switch transistor, which is not limited here. As shown in FIGS. 2a, 2c 2d and 3c, when the third switch transistor (M3) is implemented to be a P-type switch transistor, and the second control signal end (CS2) is at a high level, the third switch transistor (M3) will be turned on and will provide the signal from the DC signal end (VC) to the driving signal output end (Output). Alternatively, as shown in FIGS. 2b, 3a, 3b and 3d, when the third switch transistor (M3) is implemented to be a N-type switch transistor, and the second control signal end (CS2) is at a low level, the third switch transistor (M3) will be turned on and will provide the signal from the DC signal end (VC) to the driving signal output end (Output).

A specific structure of the first output module in the shift register is merely described above by way of example, and in a specific implementation, the specific structure of the first output module is not limited to the above structure according to the embodiment of the present disclosure, and may also be another structure well-known by those skilled in the art, which is not limited here.

Figure 2A:
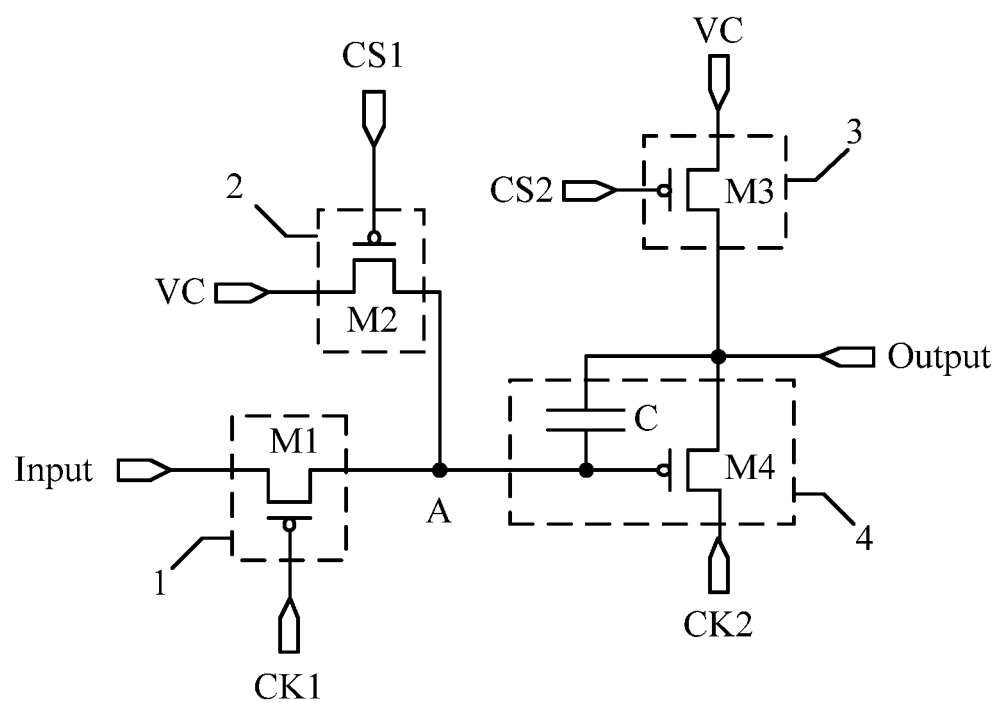
FIG. 2a is a detailed structural diagram illustrating the shift register according to the embodiment of the present disclosure.
Figure 2B:
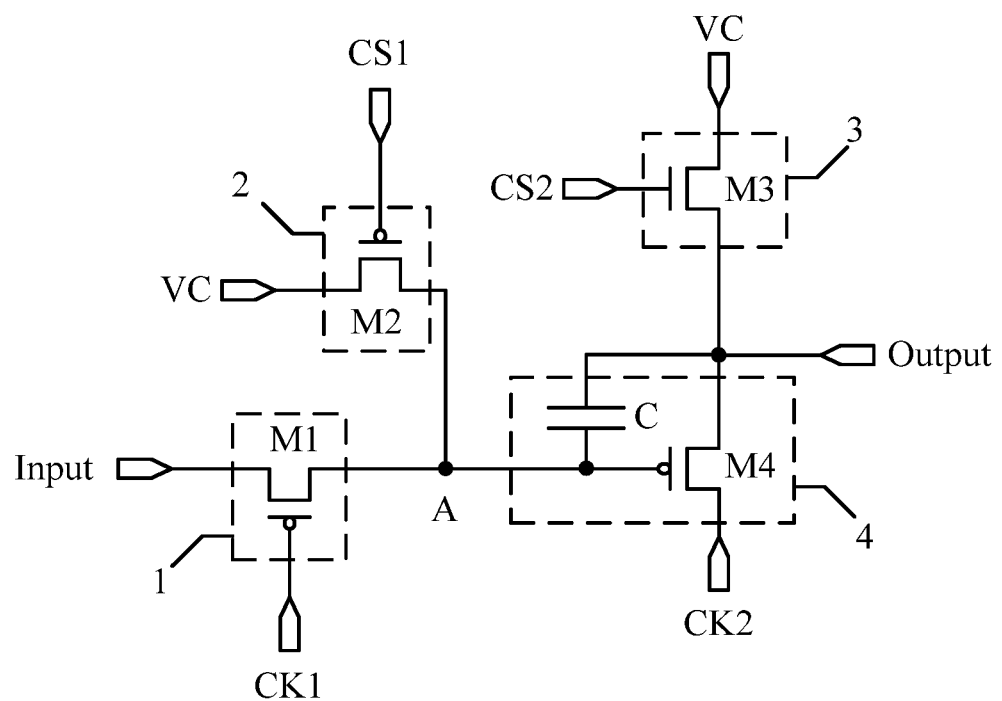
FIG. 2b is a detailed structural diagram illustrating the shift register according to the embodiment of the present disclosure.
Figure 2C:
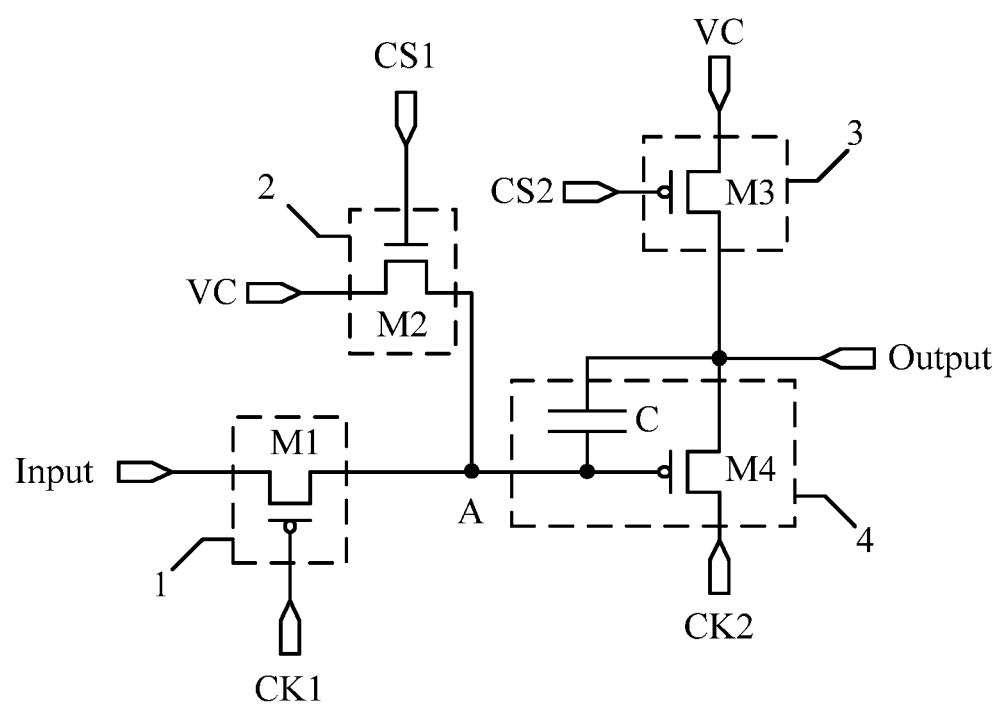
FIG. 2c is a detailed structural diagram illustrating the shift register according to the embodiment of the present disclosure.
Figure 2D:
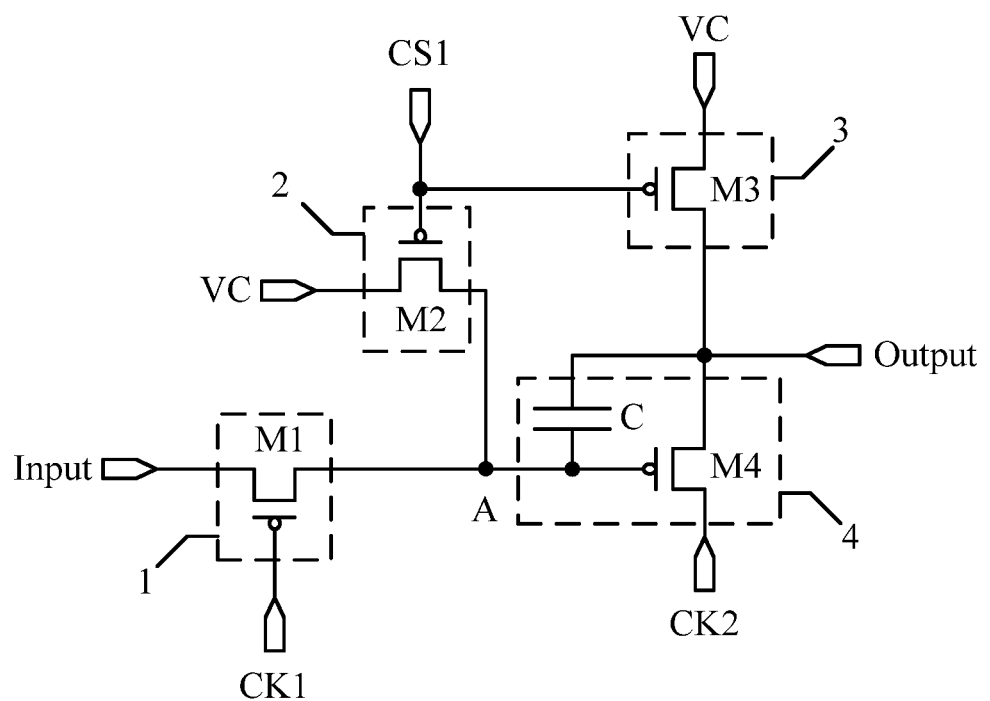
FIG. 2d is a detailed structural diagram illustrating the shift register according to the embodiment of the present disclosure.
Figure 3A:
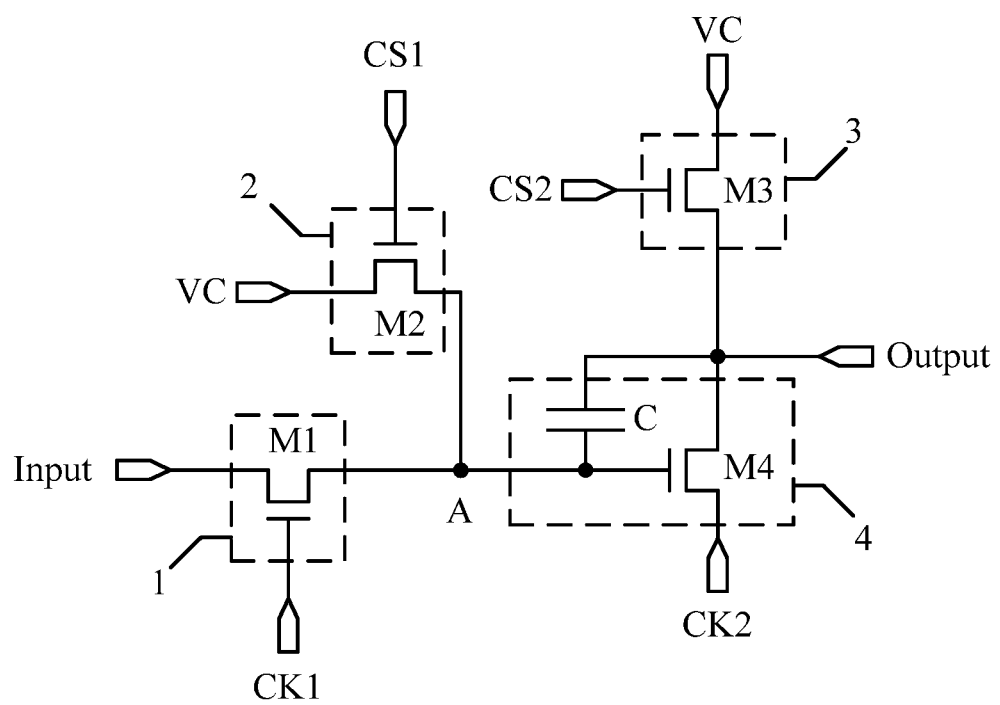
FIG. 3a is a detailed structural diagram illustrating the shift register according to the embodiment of the present disclosure.
Figure 3B:
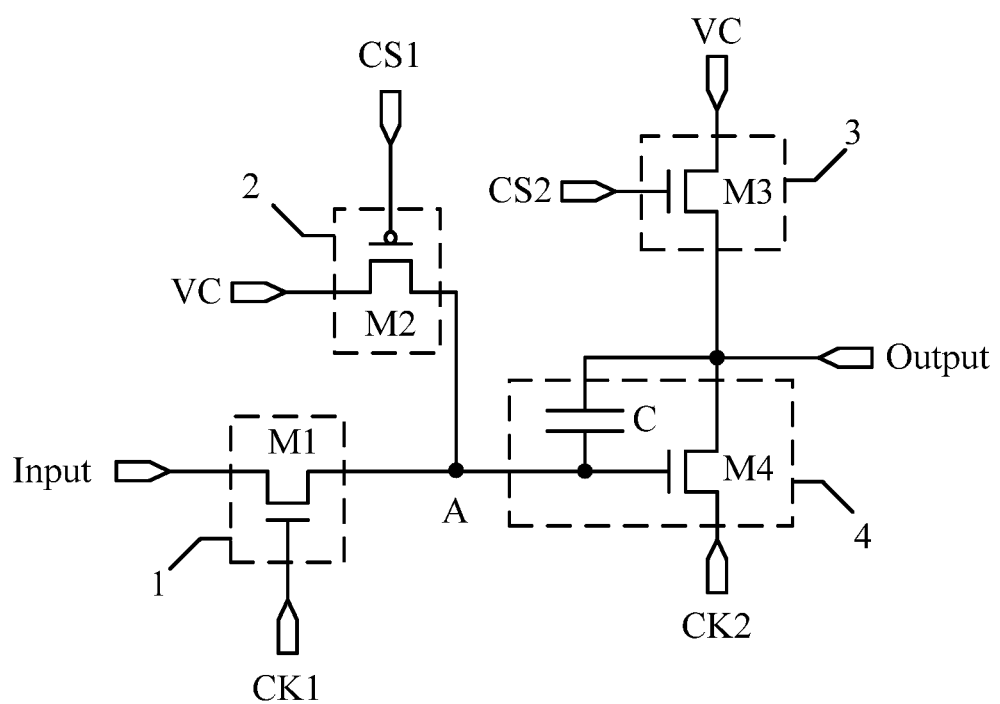
FIG. 3b is a detailed structural diagram illustrating the shift register according to the embodiment of the present disclosure.
Figure 3C:
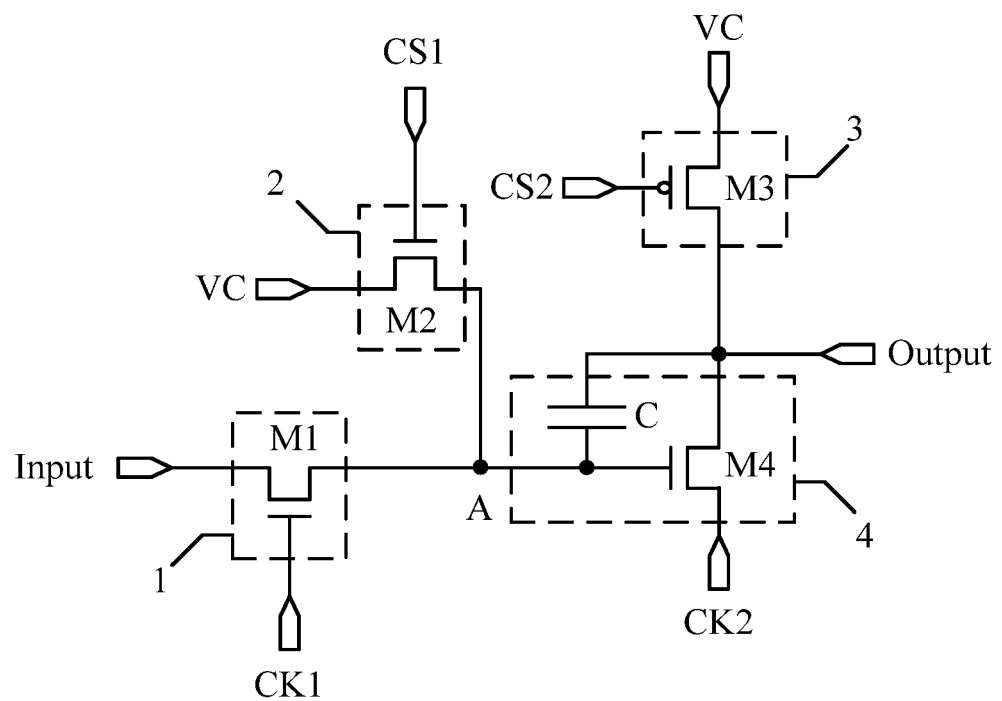
FIG. 3c is a detailed structural diagram illustrating the shift register according to the embodiment of the present disclosure.
Figure 3D:
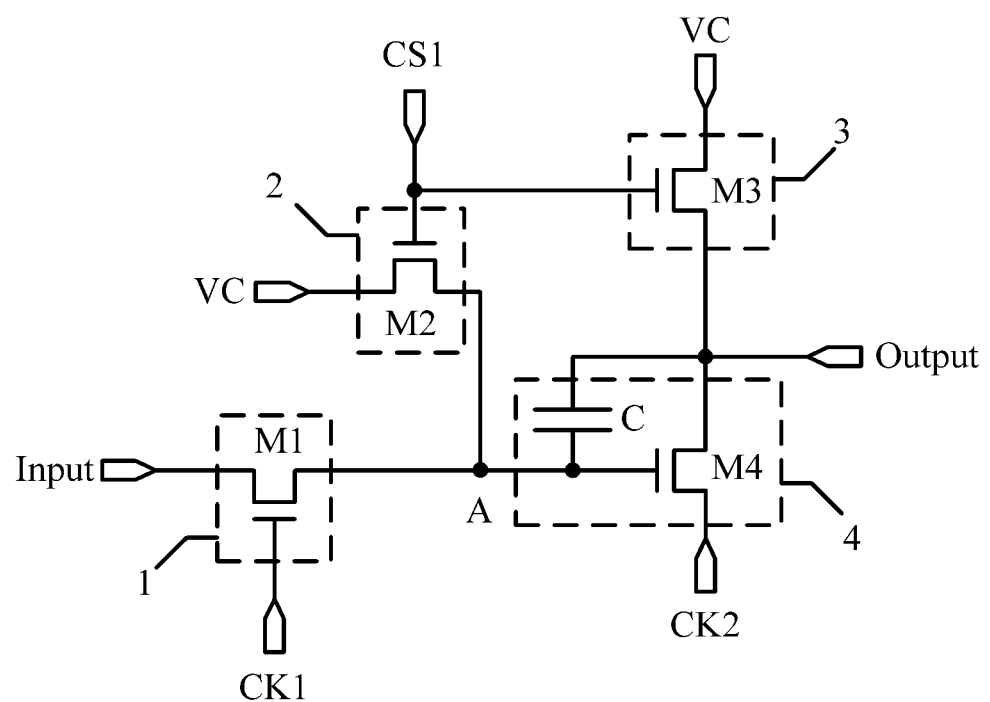
FIG. 3d is a detailed structural diagram illustrating the shift register according to the embodiment of the present disclosure.

In a specific implementation, the second switch transistor (M2) and the third switch transistor (M3) may be both implemented as a P-type switch transistor (as shown in FIGS. 2a and 2d) or a N-type switch transistor (as shown in FIGS. 3a and 3d). In this way, the first control signal end (CS1) and the second control signal end (CS2) can be implemented with the same control signal end. As shown in FIGS. 2d and 3d, the second control signal end (CS2) may be used as the first control signal end (CS1), thus the first control signal end (CS1) may control the turning-on and turning-off of the second switch transistor (M2) and the third switch transistor (M3) both. It is obvious that the first control signal end (CS1) can also be used as the second control signal end (CS2). In this case, the second control signal end (CS2) may control the turning-on and turning-off of the second switch transistor (M2) and the third switch transistor (M3) both, which is not limited here. By setting the second switch transistor (M2) and the third switch transistor (M3) as the same type of switch transistors, a uniform control signal can be used to control these two switch transistors, so as to reduce the number of the signal lines.

In particular, as shown in FIGS. 2a to 3d, the second output module 4 may further comprise a fourth switch transistor (M4) and a capacitor (C).

The fourth switch transistor (M4) may have a source connected to the second clock signal end (CK2), a gate connected to the first node (A), and a drain connected to the driving signal output end (Output).

The capacitor (C) has a first end connected to the first node (A) and a second end connected to the driving signal output end (Output).

In an implementation, when an active pulse signal of the input signal end (Input) is at a low level, as shown in FIGS. 2a to 2d, the fourth switch transistor (M4) can be implemented as a P-type switch transistor. Alternatively, when an active pulse signal of the input signal end (Input) is at a high level, as shown in FIGS. 3a to 3d, the fourth switch transistor (M4) can be implemented as a N-type switch transistor, which is not limited here.

Further, when the fourth switch transistor (M4) is turned on under the control of the first node (A), the second clock signal from the second clock signal end (CK2) is provided to the driving signal output end (Output) through the fourth switch transistor (M4). Meanwhile, when the first node (A) is in a floating state, a voltage difference between opposite ends of the capacitor (C), i.e. between the first node (A) and the driving signal output end (Output), is maintained in a stable state due to a bootstrapping effect of the capacitor (C).

A specific structure of the second output module 4 in the shift register is merely described above by way of example, and in a specific implementation, the specific structure of the second output module 4 is not limited to the above structure according to the embodiment of the present disclosure, and may also be another structure well-known by those skilled in the art, which is not limited here.

Preferably, in order to simplify the manufacturing process, in an implementation, all of the switch transistors can be implemented as P-type switch transistors (as shown in FIGS. 2a and 2d) or N-type switch transistors (as shown in FIGS. 3a and 3d), which is not limited here.

Further, in one implementation, the P-type switch transistor will be turned off under a high level, and the N-type switch transistor will be turned off under a low level.

It should be noted that the switch transistors mentioned above can be implemented with thin film transistors (TFTs) or metal oxide semiconductors (MOS), which is not limited here. In an implementation, a source and a drain of each of these transistors may have interchangeable functions according to a type of the transistor and an input signal, and thus are not specifically distinguished here.

In the following description, by taking all of the switch transistors in the shift register being P-type switch transistors or N-type switch transistors for an example respectively, operations of the shift register according to the present disclosure will be discussed with reference to a circuit timing diagram, wherein 1 represents a high level signal, 0 represents a low level signal.

First Embodiment

Figure 4A:
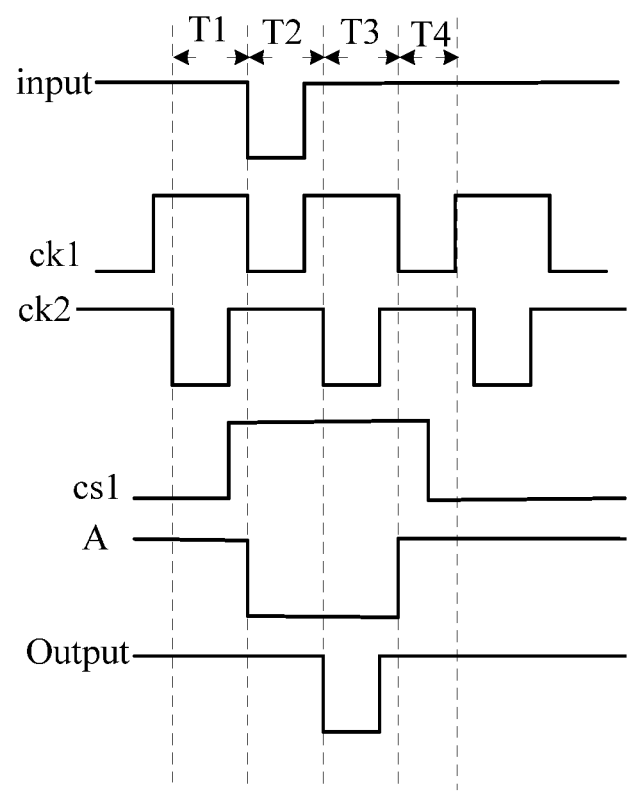
FIG. 4a is a circuit timing diagram of the shift register illustrated in FIG. 2d.

An operation process of a shift register will be described by taking a structure of the shift register illustrated in FIG. 2d as an example. In the shift register shown in FIG. 2d, all of the switch transistors are P-type switch transistors, which will be turned on under a low level and turned off under a high level. The DC signal end (VC) is at a high level. The input and output timing diagrams of the corresponding shift register are shown in FIG. 4a, in which four phases, i.e., a first phase T1, a second phase T2, a third phase T3 and a fourth phase T4 are selected.

In the first phase T1, Input=1, CK1=1, CK2=0 and CS1=0. As Input=1, the first switch transistor (M1) is turned off. As CS1=0, both the second switch transistor (M2) and the third switch transistor (M3) are turned on. Since the second switch transistor (M2) is turned on and provides the high level signal from the DC signal end (VC) to the first node (A), the first node (A) is at a high level. Then the fourth switch transistor (M4) is turned off due to the high level at first node (A). Finally, the third switch transistor (M3) is turned on and provides the high level signal from the DC signal end (VC) to the driving signal output end (Output). Thus, the driving signal output end (Output) will output a high level scanning signal.

Then, Input=1, CK1=1, CK2=1 and CS1=1. As CK1=1, the first switch transistor (M1) is turned off. Furthermore, as CS1=1, both the second switch transistor (M2) and the third switch transistor (M3) are also turned off. Since the first switch transistor (M1) and the second switch transistor (M2) are both turned off, the first node (A) is in a floating state. At this time, due to the bootstrapping effect of the capacitor (C), the first node (A) is maintained at high level in a previous period, and thus the fourth switch transistor (M4) is still turned off. Finally, the driving signal output end (Output) keeps in outputting the high level scanning signal in a first half period of the first phase T1.

In the second phase T2, Input=0, CK1=0, CK2=1 and CS1=1. As CS1=1, both the second switch transistor (M2) and the third switch transistor (M3) are turned off. As CK1=0, the first switch transistor (M1) is turned on, and provides the low level signal from the input signal end (Input) to the first node (A). Thus, the first node (A) is at a low level. Since the first node (A) is at a low level, the fourth switch transistor (M4) is turned on, and the fourth switch transistor (M4) will provide the high level signal from the second clock signal end (CK2) to the driving signal output end (Output). Accordingly, the capacitor (C) will be charged, and the driving signal output end (Output) will output a high level scanning signal.

Then, Input=1, CK1=1, CK2=1 and CS1=1. As CK1=1, the first switch transistor (M1) is turned off. As CS1=1, the second switch transistor (M2) and the third switch transistor (M3) are both turned off. Since both the first switch transistor (M1) and the second switch transistor (M2) are turned off, the first node (A) is in a floating state. At this time, due to the bootstrapping effect of the capacitor (C), the first node (A) is maintained at a low level in a previous period, and thus the fourth switch transistor (M4) is still turned on. Since the fourth switch transistor (M4) is still turned on and will provide the high level signal from the second clock signal end (CK2) to the driving signal output end (Output), the driving signal output end (Output) keeps in outputting the high level scanning signal.

In the third phase T3, Input=1, CK1=1, CK2=0 and CS1=1. As CK1=1, the first switch transistor (M1) is turned off. As CS1=1, both the second switch transistor (M2) and the third switch transistor (M3) are turned off. Since both the first switch transistor (M1) and the second switch transistor (M2) are turned off, the first node (A) is in a floating state. At this time, due to the bootstrapping effect of the capacitor (C), the first node (A) is maintained at a low level in a previous period, and thus the fourth switch transistor (M4) is still turned on. Since the fourth switch transistor (M4) is still turned on and then the low level signal from the second clock signal end (CK2) will be provided to the driving signal output end (Output) through the fourth switch transistor (M4), the driving signal output end (Output) outputs a low level scanning signal.

Then, Input=1, CK1=1, CK2=1 and CS1=1. As CK1=1, the first switch transistor (M1) is turned off. As CS1=1, both the second switch transistor (M2) and the third switch transistor (M3) are turned off. Since both the first switch transistor (M1) and the second switch transistor (M2) are turned off, the first node (A) is in a floating state. At this time, due to the bootstrapping effect of the capacitor (C), the first node (A) is maintained at a low level in a previous period, and thus the fourth switch transistor (M4) is still turned on. Since the fourth switch transistor (M4) is still turned on and will be provide the high level signal from the second clock signal end (CK2) to the driving signal output end (Output), the driving signal output end (Output) outputs a high level scanning signal.

In the fourth phase T4, Input=1, CK1=0, CK2=1 and CS1=1. As CK1=0, the first switch transistor (M1) is turned on, and will provide the high level signal from the input signal end (Input) to the first node (A). Thus, the first node (A) is at a high level. Since the first node (A) is at a high level, the fourth switch transistor (M4) is turned off. As CS1=1, both the second switch transistor (M2) and the third switch transistor (M3) are turned off. Since both the third switch transistor (M3) and the fourth switch transistor (M4) are turned off, the driving signal output end (Output) keeps in outputting the high level scanning signal in the latter half period of the third phase T3.

Then, Input=1, CK1=0, CK2=1 and CS1=0. As CK1=0, the first switch transistor (M1) is turned on, and will provide the high level signal from the input signal end (Input) to the first node (A). Thus, the first node (A) is at a high level. Since the first node (A) is at a high level, the fourth switch transistor (M4) is turned off. As CS1=0, both the second switch transistor (M2) and the third switch transistor (M3) are turned on. Since the second switch transistor (M2) is turned on and will provide the high level signal from the DC signal end (VC) to the first node (A), it is ensured that the first node (A) is at a high level, so as to ensure the fourth switch transistor (M4) being turned off. Furthermore, since the third switch transistor (M3) is turned on and will provide the high level signal from the DC signal end (VC) to the driving signal output end (Output), the driving signal output end (Output) outputs the high level scanning signal.

The shift register according to the embodiment of the present disclosure, after the fourth phase, the second switch transistor is turned on due to CS1=0 and will provide the high level signal from the DC signal end to the first node. Thus, the first node is at a high level. The fourth switch transistor is turned off due to the high level at the first node, having no influence on the output of the driving signal output end. The third switch transistor is turned on due to CS1=0 and will provide the high level signal from the DC signal end to the driving signal output end, so as to ensure the driving signal output end keep in outputting the high level scanning signal until the next frame begins.

In the shift register according to the embodiment of the present disclosure, the output of the scanning signal can be achieved by using only four switch transistors and a capacitor. Thus, the manufacturing process is simplified, and the production cost is also reduced.

Second Embodiment

Figure 4B:
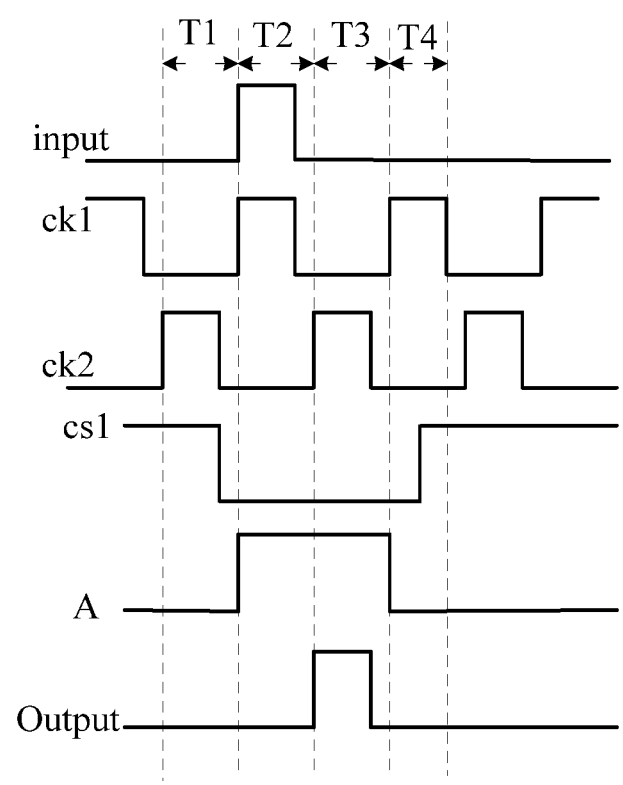
FIG. 4b is a circuit timing diagram of the shift register illustrated in FIG. 3d.

An operation process of a shift register will be described by taking a structure of the shift register illustrated in FIG. 3d as an example. In the shift register shown in FIG. 3d, all of the switch transistors are N-type switch transistors, which will be turned on under a high level and turned off under a low level. The DC signal end (VC) is at a low level. The input and output timing diagrams of the corresponding shift register are shown in FIG. 4b, in which four phases, i.e., a first phase T1, a second phase T2, a third phase T3 and a fourth phase T4 are selected.

In the first phase T1, Input=1, CK1=0, CK2=1 and CS 1=1. As CK1=0, the first switch transistor (M1) is turned off. As CS 1=1, both the second switch transistor (M2) and the third switch transistor (M3) are turned on. Since both the second switch transistor (M2) are turned on and will provide the low level signal from the DC signal end (VC) to the first node (A), the first node is at a low level. Since the first node (A) is at a low level, the fourth switch transistor (M4) is turned off. Since the third switch transistor (M3) is turned on and will provide the low level signal from the DC signal end (VC) to the driving signal output end (Output), the driving signal output end (Output) outputs a low level scanning signal.

Then, Input=0, CK1=0, CK2=0 and CS 1=0. As CK1=0, the first switch transistor (M1) is turned off. As CS 1=0, both the second switch transistor (M2) and the third switch transistor (M3) are turned off. Since the first switch transistor (M1) and the second switch transistor (M2) are both turned off, the first node (A) is in a floating state. At this time, due to the bootstrapping effect of the capacitor (C), the first node (A) is maintained at a low level in a previous period, and thus the fourth switch transistor (M4) is still turned off. Accordingly, the driving signal output end (Output) keeps in outputting the low level scanning signal in a first half period.

In the second phase T2, Input=1, CK1=1, CK2=0 and CS1=0. As CS1=0, both the second switch transistor (M2) and the third switch transistor (M3) are turned off. As CK1=1, the first switch transistor (M1) is turned on and will provide the high level signal from the input signal end (Input) to the first node (A). Thus, the first node (A) is at a high level. Since the first node (A) is at a high level, the fourth switch transistor (M4) is turned on, and will provide the low level signal from the second clock signal end (CK2) to the driving signal output end (Output). Therefore, the capacitor (C) will be charged, and the driving signal output end (Output) outputs the low level scanning signal.

Then, Input=0, CK1=0, CK2=0 and CS1=0. As CK1=0, the first switch transistor (M1) is turned off. As CS1=0, both the second switch transistor (M2) and the third switch transistor (M3) are turned off. Since both the first switch transistor (M1) and the second switch transistor (M2) are turned off, the first node (A) is in a floating state. At this time, due to the bootstrapping effect of the capacitor (C), the first node (A) is maintained at a high level in a previous period, and thus the fourth switch transistor (M4) is still turned on. Since the fourth switch transistor (M4) is still turned on and will provide the low level signal from the second clock signal end (CK2) to the driving signal output end (Output), the driving signal output end (Output) outputs the low level scanning signal.

In the third phase T3, Input=0, CK1=0, CK2=1 and CS1=0. As CK1=0, the first switch transistor (M1) is turned off. As CS1=0, t both he second switch transistor (M2) and the third switch transistor (M3) are turned off. Since both the first switch transistor (M1) and the second switch transistor (M2) are turned off, the first node (A) is in a floating state. At this time, due to the bootstrapping effect of the capacitor (C), the first node (A) is maintained at a high level in a previous period, and thus the fourth switch transistor (M4) is still turned on. Since the fourth switch transistor (M4) is still turned on and will provide the high level signal from the second clock signal end (CK2) to the driving signal output end (Output), the driving signal output end (Output) outputs a high level scanning signal.

Then, Input=0, CK1=0, CK2=0 and CS1=0. As CK1=0, the first switch transistor (M1) is turned off. As CS1=0, both the second switch transistor (M2) and the third switch transistor (M3) are turned off. Since both the first switch transistor (M1) and the second switch transistor (M2) are turned off, the first node (A) is in a floating state. At this time, due to the bootstrapping effect of the capacitor (C), the first node (A) is maintained at a high level in a previous period, and thus the fourth switch transistor (M4) is still turned on. Since the fourth switch transistor (M4) is still turned on and will be provide the low level signal from the second clock signal end (CK2) to the driving signal output end (Output), the driving signal output end (Output) outputs a low level scanning signal.

In the fourth phase T4, Input=0, CK1=1, CK2=0 and CS1=0. As CK1=1, the first switch transistor (M1) is turned on, and will provide the low level signal from the input signal end (Input) to the first node (A). Thus, the first node (A) is at a low level. Since the first node (A) is at a low level, the fourth switch transistor (M4) is turned off. As CS1=0, both the second switch transistor (M2) and the third switch transistor (M3) are turned off. Since both the third switch transistor (M3) and the fourth switch transistor (M4) are turned off, the driving signal output end (Output) keeps in outputting the low level scanning signal in the latter half period of the third phase T3.

Then, Input=0, CK1=1, CK2=0 and CS1=1. As CK1=1, the first switch transistor (M1) is turned on, and will provide the high level signal from the DC signal end (VC) to the first node (A). Thus, the first node (A) is at a low level. Since the first node (A) is at a low level, the fourth switch transistor (M4) is turned off. As CS1=1, the second switch transistor (M2) and the third switch transistor (M3) are turned on. Since the second switch transistor (M2) is turned on and will provide the low level signal from the DC signal end (VC) to the first node (A), it is ensured that the first node (A) is at a low level, so as to ensure the fourth switch transistor (M4) being turned off. Furthermore, since the third switch transistor (M3) is turned on and will provide the low level signal from the DC signal end (VC) to the driving signal output end (Output), the driving signal output end (Output) outputs the low level scanning signal.

In the above shift register according to the embodiment of the present disclosure, after the fourth phase, the second switch transistor is turned on due to CS1=1 and the low level signal from the DC signal end will be provided to the first node. Thus, the first node is at a low level. The fourth switch transistor is turned off due to the low level at the first node, having no influence on the output of the driving signal output end. The third switch transistor is turned on due to CS1=1 and will provide the low level signal from the DC signal end to the driving signal output end, so as to ensure the driving signal output end keep in outputting the low level scanning signal until the next frame begins.

In the shift register according to the embodiment of the present disclosure, the output of the scanning signal can be achieved by using only four switch transistors and a capacitor. Thus, the manufacturing process is simplified, and the production cost is also reduced.

Figure 5:
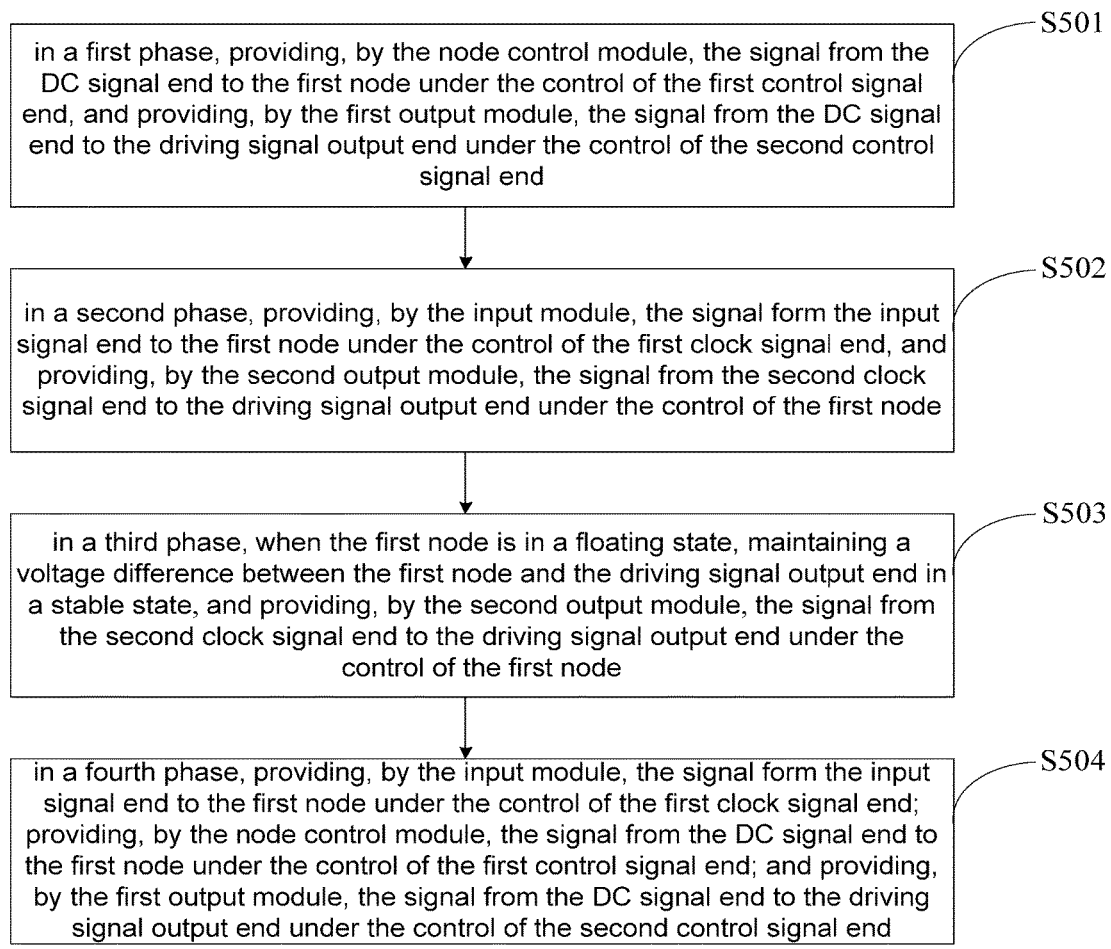
FIG. 5 is a flow chart illustrating a method for driving a shift register according to an embodiment of the present disclosure.

Based on the same inventive concept, the embodiments of the present disclosure further provide a method for driving any of the shift registers discussed above. As shown in FIG. 5, the method may comprise: a first phase (S501), a second phase (S502), a third phase (S503) and a fourth phase (S504), In a first phase (S501), the node control module may provide the signal from the DC signal end to the first node under the control of the first control signal end. The first output module may provide the signal from the DC signal end to the driving signal output end under the control of the second control signal end.

In a second phase (S502), the input module may provide the signal from the input signal end to the first node under the control of the first clock signal end. Furthermore, the second output module may provide the signal from the second clock signal end to the driving signal output end under the control of the first node.

In a third phase (S503), when the first node is in a floating state, a voltage difference between the first node and the driving signal output end is maintained in a stable state by the second output module. Additionally, the second output module may further provide the signal from the second clock signal end to the driving signal output end under the control of the first node.

In a fourth phase (S504), the input module may provide the signal from the input signal end to the first node under the control of the first clock signal end. The node control module may provide the signal from the DC signal end to the first node under the control of the first control signal end. Furthermore, the first output module may provide the signal from the DC signal end to the driving signal output end under the control of the second control signal end.

Figure 6:
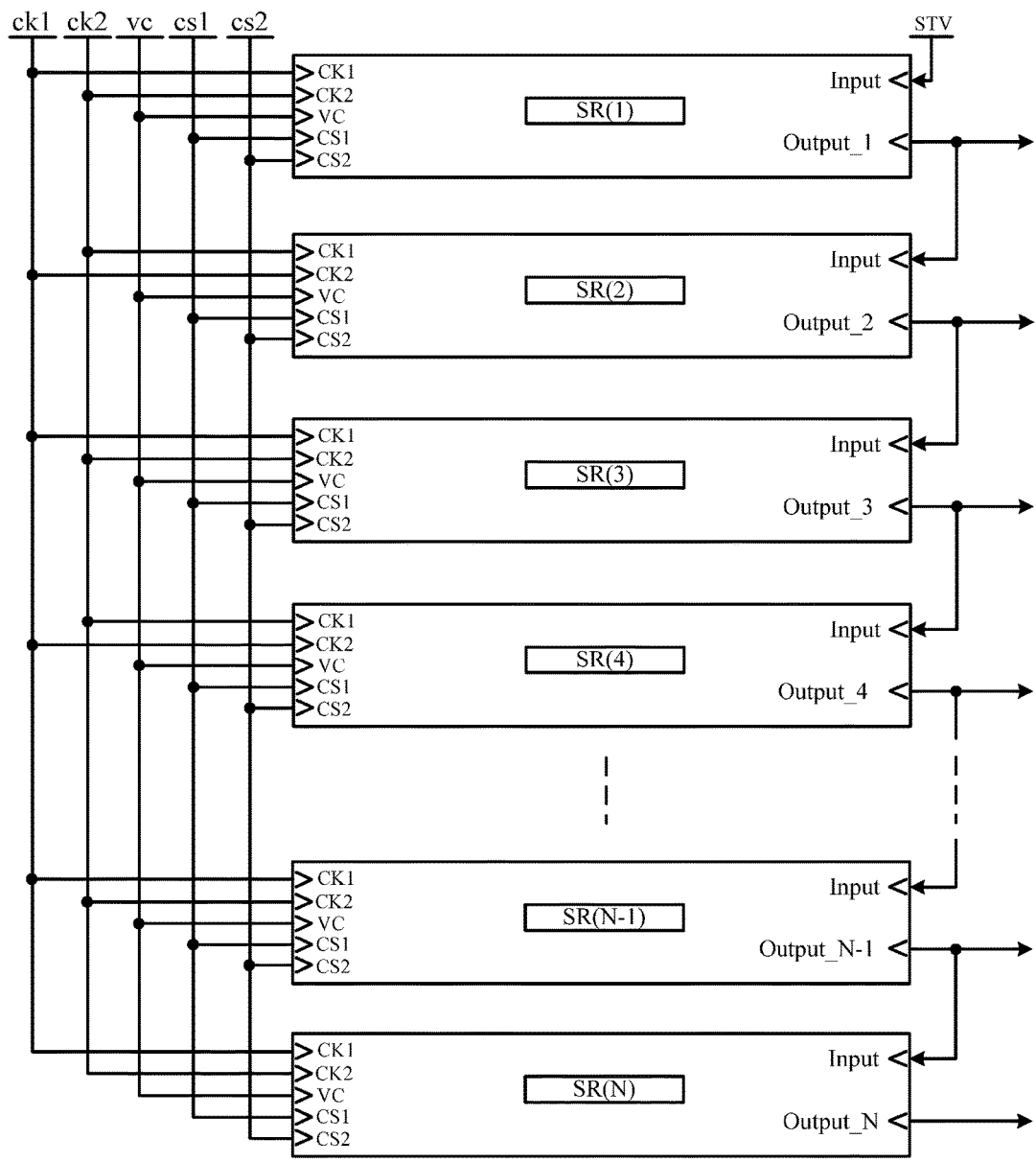
FIG. 6 is a structural diagram illustrating a gate driving circuit according to an embodiment of the present disclosure.

Based on the same inventive concept, the embodiments of the present disclosure may further provide a gate driving circuit, as shown in FIG. 6, comprising a plurality of cascaded shift registers, which are SR(1), SR(2) . . . SR(n) . . . SR(N−1), SR(N) (totally N shift registers, wherein $1 \leq n \leq N$). An input signal end (Input) of the first stage of shift register SR(1) is connected to a frame trigger signal end (STV), and each of input signal ends (Input) of remaining various stages of shift registers SR(n) except for the first stage of shift register SR(1) is connected to a driving signal output end (Output_n−1) of a previous stage of shift register SR(n−1).

In addition, each of the various stages of shift registers in the above gate driving circuit may have a similar construction and function with the shift register according to the present disclosure, and the description of which will not be discussed in detail. The gate driving circuit can be applied in a liquid crystal display panel or an organic light emitting display (OLED) panel, which is not limited here.

Further, in the above gate driving circuit, each of the various stages of shift registers may comprise an input signal end, a first clock signal end, a second clock signal end, a first control signal end, a second control signal end and a DC signal end.

In particular, in the above gate driving circuit, as shown in FIG. 6, a signal from the first clock signal end (CK1) of the $(2k-1)^{th}$ stage of shift register and a signal from the second clock signal end (CK2) of the $(2k)^{th}$ stage of shift register may come from the same clock signal end (i.e. the first clock signal end (CK1)), wherein k is a positive integer above 0. Furthermore, a signal from the second clock signal end (CK2) of the $(2k-1)^{th}$ stage of shift register and a signal from the first clock signal end (CK1) of the $(2k)^{th}$ stage of shift register may come from the same clock signal end (i.e. the second clock signal end (CK1)).

Figure 7:
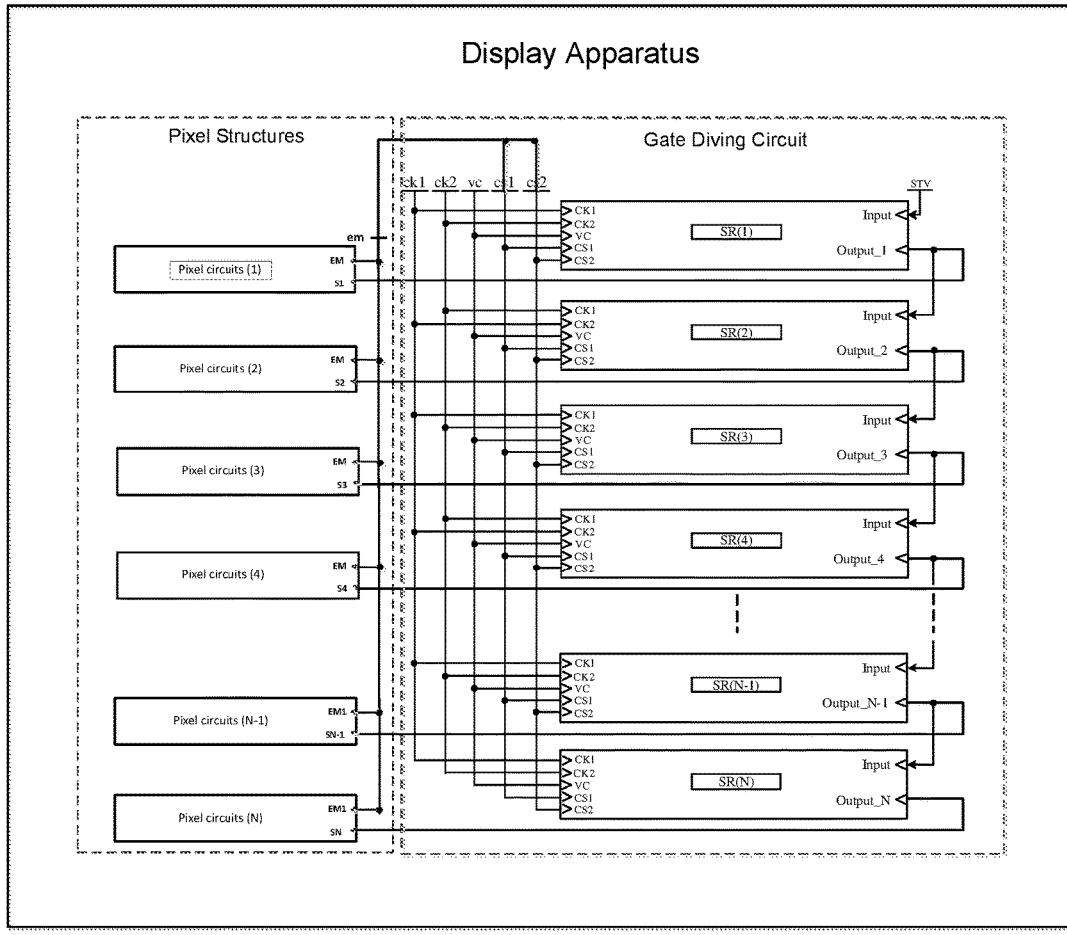
FIG. 7 is a structural block diagram illustrating a display apparatus according to an embodiment of the present disclosure.

Based on the same inventive concept, the embodiments of the present disclosure may further provide a display apparatus comprising the gate driving circuit discussed above. FIG. 7 is a structural block diagram illustrating a display apparatus according to an embodiment of the present disclosure. Scanning signals are provided by the gate driving circuit to various gate lines on an array substrate in the display apparatus. A specific implementation thereof can be known with reference to the description of the gate driving circuit described above, and the same content will no longer be repeated.

Further, the display apparatus according to the embodiments of the present disclosure may be an organic light emitting display (OLED) apparatus.

Generally, the OLED apparatus may comprise a plurality of pixel structures arranged in an array, wherein each pixel structure may have at least one light emitting pixel and a pixel circuit corresponding to the at least one light emitting pixel, and each row of pixel circuits are connected to the shift register which is arranged in this row and an input scanning signal. During a frame, the light emitting pixels will emit light under the control of an active pulse signal for a light emitting control signal end in a light emitting period; and in other periods, the light emitting pixels will not emit light and the level of the signal from the light emitting control signal end is opposite with the active pulse signal. Since the input signal is not inputted when the light emitting pixels are in a light emitting period during the frame, the signal from the light emitting control signal end is an active pulse signal. Meanwhile, since the input signal is inputted when the light emitting pixels are not emitting light, the signal from the light emitting control signal end is opposite with the active pulse signal. After outputting the scanning signals, the signal from the light emitting control signal end turns into an active pulse signal, so as to enable the light emitting pixels keeping in emitting light. In view of this, the timing of the signal from the light emitting control signal end in the pixel circuit of the OLED apparatus may meet requirements for the timing of the first control signal end and the timing of the second control signal end in the shift register according to the embodiments of the present disclosure. Therefore, the timing of the signal from the light emitting control signal end in the pixel circuit can be applied into the shift register, so as to achieve the output of the scanning signals. This may reduce the number of the control signal lines and simplify the manufacturing process.

Accordingly, in the above display apparatus, the OLED apparatus may preferably comprise a plurality of pixel circuits which are arranged in an array and may at least have a light emitting control signal end (EM) and a scanning signal end (S).

Each row of the pixel circuits may corresponds to a shift register in the gate driving circuit. The light emitting control signal end (EM) of each row of the pixel circuits may be connected to the first control signal end and the second control signal end of the corresponding shift register, and the scanning signal end (S) of each row of the pixel circuits may be connected to the driving signal output end of the corresponding shift register.

According to the embodiments of the disclosure, a shift register and a method for driving the same, a gate driving circuit and a display apparatus may be provided. The shift register may comprise an input module, a node control module, a first output module and a second output module. The input module is configured to control the potential at a first node via an input signal end and a first clock signal end, the node control module is configured to control the potential at a first node via a first control signal end and a DC signal end, the first output module is configured to control the potential at a driving signal output end via a second control signal end and the DC signal end, and the second output module is configured to maintain a voltage difference between the first node and the driving signal output end in a stable state when the first node is in a floating state and to control the potential at the driving signal output end via the first node and the second clock signal end. Thus, by cooperating with each other, these four modules may achieve the outputs of scanning signals with a simpler structure and a fewer signal lines, so as to simplify the manufacturing process and reduce the production cost.

Obviously, those skilled in the art can make various modifications and variations to the present disclosure without departing from the spirit and scope of the present disclosure. Thus, if these modifications and variations of the present disclosure belong to the scope of the claims of the present disclosure and the equivalent technologies thereof, the present disclosure is also intended to include these modifications and variations.

I claim:

1. A shift register, comprising:
    an input module having a first end connected to an input signal end, a second end connected to a first clock signal end, and a third end connected to a first node, the input module being configured to provide a signal from the input signal end to the first node under the control of the first clock signal end;
    a node control module having a first end connected to a DC signal end, a second end connected to a first control signal end and a third end connected to the first node, the node control module being configured to provide a signal from the DC signal end to the first node under the control of the first control signal end;
    a first output module having a first end connected to the DC signal end, a second end connected to a second control signal end, and a third end connected to a driving signal output end of the shift register, the first output module being configured to provide the signal from the DC signal end to the driving signal output end under the control of the second control signal end; and
    a second output module having a first end connected to a second clock signal end, a second end connected to the first node, and a third end connected to the driving signal output end, the second output module being configured to provide a signal from the second clock signal end to the driving signal output end under the control of the first node and to maintain a voltage difference between the first node and the driving signal output end in a stable state when the first node is in a floating state, wherein the input module and the node control module are configured such that the first node is in the floating state under the control of the first clock signal end and the first control signal end, and when a signal from the first clock signal end is at an active level, a signal from the first control signal end comprises an inactive period and an active period, such that the voltage difference between the first node and the driving signal output end is maintained to be in the stable state.

2. The shift register of claim 1, wherein the input module further comprises a first switch transistor having a source connected to the input signal end, a gate connected to the first clock signal end, and a drain connected to the first node.

3. The shift register of claim 1, wherein the node control module further comprises a second switch transistor having a source connected to the DC signal end, a gate connected to the first control signal end, and a drain connected to the first node.

4. The shift register of claim 1, wherein the first output module further comprises a third switch transistor having a source connected to the DC signal end, a gate connected to the second control signal end, and a drain connected to the driving signal output end.

5. The shift register of claim 1, wherein the second output module further comprises a fourth switch transistor and a capacitor,
wherein the fourth switch transistor has a source connected to the second clock signal end, a gate connected to the first node, and a drain connected to the driving signal output end, and
the capacitor has a first end connected to the first node and a second end connected to the driving signal output end.

6. The shift register of claim 1, wherein the first control signal end and the second control signal end are the same control signal end.

7. A method for driving the shift register of claim 1, comprising:
in a first phase, providing, by the node control module, the signal from the DC signal end to the first node under the control of the first control signal end, and providing, by the first output module, the signal from the DC signal end to the driving signal output end under the control of the second control signal end;
in a second phase, providing, by the input module, the signal from the input signal end to the first node under the control of the first clock signal end, and providing, by the second output module, the signal from the second clock signal end to the driving signal output end under the control of the first node;

in a third phase, the first node being in a floating state, and maintaining a voltage difference between the first node and the driving signal output end in a stable state, and providing, by the second output module, the signal from the second clock signal end to the driving signal output end under the control of the first node; and in a fourth phase, providing, by the input module, the signal from the input signal end to the first node under the control of the first clock signal end, providing, by the node control module, the signal from the DC signal end to the first node under the control of the first control signal end; and providing, by the first output module, the signal from the DC signal end to the driving signal output end under the control of the second control signal end, wherein the first node is in the floating state under the control of the first clock signal end and the first control signal end, and when a signal from the first clock signal end is at an active level, a signal from the first control signal end comprises an inactive period and an active period, such that the voltage difference between the first node and the driving signal output end is maintained to be in the stable state.

8. A gate driving circuit comprising a plurality of cascaded shift registers of claim 1, wherein:
an input signal end of a first stage of shift register is connected to a frame trigger signal end; and
each of input signal ends of remaining various stages of shift registers except for the first stage of shift register is connected to a driving signal output end of a previous stage of shift register.

9. A display apparatus comprising the gate driving circuit of claim 8.

10. The display apparatus of claim 9, wherein the display apparatus is an organic light emitting display (OLED) apparatus.

11. The display apparatus of claim 10, wherein the OLED apparatus comprise a plurality of pixel circuits which are arranged in an array and configured to at least have light emitting control signal ends and scanning signal ends, and
wherein each row of the pixel circuits corresponds to a shift register in the gate driving circuit, the light emitting control signal end of each row of the pixel circuits being connected to the first control signal end and the second control signal end of the corresponding shift register, and the scanning signal end of each row of the pixel circuits being connected to the driving signal output end of the corresponding shift register.

* * * * *